(12) United States Patent
Denorme et al.

(10) Patent No.: US 11,250,930 B2
(45) Date of Patent: Feb. 15, 2022

(54) ELECTRONIC CHIP MEMORY

(71) Applicants: STMicroelectronics SA, Montrouge (FR); STMicroelectronics (Rousset) SAS, Rousset (FR)

(72) Inventors: Stephane Denorme, Crolles (FR); Philippe Candelier, St Mury Monteymond (FR); Joel Damiens, Le Touvet (FR); Fabrice Marinet, Chateauneuf le Rouge (FR)

(73) Assignees: STMICROELECTRONICS SA, Montrouge (FR); STMICROELECTRONICS (ROUSSET) SAS, Rousset (FR)

( * ) Notice: Subject to any disclaimer, the term of this patent is extended or adjusted under 35 U.S.C. 154(b) by 36 days.

(21) Appl. No.: 16/709,019

(22) Filed: Dec. 10, 2019

(65) Prior Publication Data

US 2020/0202972 A1 Jun. 25, 2020

(30) Foreign Application Priority Data

Dec. 21, 2018 (FR) .................................... 1873833

(51) Int. Cl.
*G11C 17/00* (2006.01)
*G11C 29/52* (2006.01)
*G11C 17/12* (2006.01)

(52) U.S. Cl.
CPC ............ *G11C 29/52* (2013.01); *G11C 17/123* (2013.01)

(58) Field of Classification Search
CPC ................................ G11C 29/52; G11C 17/123
USPC ........................................................... 365/96
See application file for complete search history.

(56) References Cited

U.S. PATENT DOCUMENTS

| 5,301,159 | A * | 4/1994 | Lee ..................... G11C 17/18 257/50 |
| 6,775,171 | B2 * | 8/2004 | Novosel ................ G11C 17/16 257/E23.147 |
| 6,897,543 | B1 | 5/2005 | Huang et al. |
| 7,539,049 | B2 * | 5/2009 | Hung ..................... G11C 11/15 365/158 |
| 8,422,265 | B2 | 4/2013 | Hui et al. |
| 9,876,123 | B2 | 1/2018 | Li et al. |
| 10,032,521 | B2 * | 7/2018 | Grigoriev ............... G11C 7/24 |
| 10,290,352 | B2 | 5/2019 | Li et al. |
| 10,886,283 | B2 | 1/2021 | Marzaki et al. |
| 2002/0060935 | A1 * | 5/2002 | Lee ..................... G11C 29/785 365/200 |
| 2003/0198085 | A1 | 10/2003 | Peng |
| 2004/0008538 | A1 | 1/2004 | Peng |
| 2011/0298054 | A1 | 12/2011 | Luan |

(Continued)

OTHER PUBLICATIONS

Sadana, S., et al., "A Highly Reliable and Unbiased PUF Based on Differential OTP Memory", IEEE Electron Device Letters, vol. 39, No. 8, Aug. 2018, pp. 1159-1162.

*Primary Examiner* — Vu A Le
(74) *Attorney, Agent, or Firm* — Slater Matsil, LLP

(57) ABSTRACT

A device includes a first switch, a first irreversibly programmable memory point, and a second irreversibly programmable memory point coupled in parallel with the first irreversibly programmable memory point. The first switch and the parallel combination of the first and second irreversibly programmable memory points are coupled in series between a first node and a second node.

19 Claims, 10 Drawing Sheets

(56) References Cited

U.S. PATENT DOCUMENTS

| | | |
|---|---|---|
| 2012/0182782 A1* | 7/2012 | Kurjanowicz .... H01L 21/28211 |
| | | 365/94 |
| 2013/0033921 A1* | 2/2013 | Tsuda ................ G11C 13/0004 |
| | | 365/148 |
| 2013/0322150 A1 | 12/2013 | Kim et al. |
| 2014/0231895 A1 | 8/2014 | Rothleitner |
| 2015/0357032 A1 | 12/2015 | Tatsumura et al. |
| 2015/0380102 A1 | 12/2015 | Choi et al. |
| 2016/0148705 A1 | 5/2016 | Lee et al. |
| 2016/0247579 A1 | 8/2016 | Ueda et al. |
| 2017/0005103 A1 | 1/2017 | Zhang et al. |
| 2018/0212058 A1 | 7/2018 | Toh et al. |

* cited by examiner

ELECTRONIC CHIP MEMORY

CROSS-REFERENCE TO RELATED APPLICATIONS

This application claims priority to French Patent Application No. 1873833, filed on Dec. 21, 2018, which application is hereby incorporated herein by reference.

This application is related to French Patent Application No. 1873830 and French Patent Application No. 1873848, filed on Dec. 21, 2018, which applications are hereby incorporated herein by reference. U.S. patent application Ser. No. 16/708,912 claims priority to French Patent Application No. 1873830 and U.S. patent application Ser. No. 16/713,947 claims priority to French Patent Application No. 1873848.

TECHNICAL FIELD

The present disclosure relates generally to electronic devices such as memories.

BACKGROUND

A memory typically comprises memory cells, generally arranged in a matrix. In an irreversibly programmable memory, each cell is initially programmable once only. After a unique programming, the irreversibly programmable cells are no longer programmable and are accessible as read-only memory, the memory thus becoming a dead memory.

Generators of physically unclonable functions are typically used to encrypt the data of a memory, with the aim of protecting the memory against an accessing of the data by an unauthorized person.

It would be desirable to be able to improve protection against attacks that aim to obtain data stored in memories, in particular dead memories.

SUMMARY

The present disclosure relates generally to electronic devices, in particular to electronic chips for integrated circuits. The present disclosure typically relates to memories, such as irreversibly programmable memories and to generators of physically unclonable functions.

One embodiment addresses all or some of the drawbacks of known memories, e.g., known irreversibly programmable memories.

One embodiment addresses all or some of the drawbacks of known generators of physically unclonable functions.

According to an aspect, an embodiment provides a device comprising at least three memory cells. For each cell there is a first doped semiconductor area and a switch coupling the cell to the first area. First doped semiconductor zones connect the first areas together.

According to an embodiment, the first zones and the first areas are located in the same semiconductor layer, preferably covering an insulating layer.

According to an embodiment, the device further comprises a conductive track connecting the first areas together.

According to an embodiment, each switch comprises a transistor comprising a gate, the gates being disjunct and having collinear elongated shapes.

According to an embodiment, each cell comprises one or more irreversibly programmable memory points, each comprising a second semiconductor zone and a gate located on the second zone.

According to an embodiment, the device comprises a conductive area that defines the gates of the memory points.

According to an embodiment, the conductive area and the gates of the transistors have a same direction of elongation.

A further embodiment provides a memory comprising devices as defined above.

According to an embodiment, the cells are arranged in a matrix, each device defining a row of the matrix.

According to an embodiment, two adjacent rows are disposed symmetrically in relation to an axis.

According to an embodiment, the conductive areas of the two adjacent rows constitute a common conductive area.

According to an embodiment, two memory points respectively located in the two adjacent rows and in a same column of the matrix have their second zones alternately in contact with the second and third semiconductor areas disposed on either side of the vertical alignment with the common conductive area.

According to an embodiment, the memory comprises a conductive track connecting together the gates of the transistors of a column of the matrix.

According to an embodiment, the memory comprises a selection circuit for selecting one of the cells and for programming the selected cell.

According to a further aspect, an embodiment provides a device comprising an association in series of a first switch and an association in parallel of first and second irreversibly programmable memory points.

According to an embodiment, the device comprises two nodes for temporarily applying a voltage for the programming of the memory points, coupled by the association in series.

According to an embodiment, a connection node between the association in parallel and the first switch comprises a first doped semiconductor area connecting the memory points.

According to an embodiment, the first switch is connected to a central part of the first area.

According to an embodiment, the connection node further comprises a second doped semiconductor area connecting the first switch to the first memory point.

According to an embodiment, the device further comprises a third doped semiconductor area connected to the second memory point, and a second switch connected to the third area.

According to an embodiment, the device comprises an additional switch connected to a central part of the first area.

According to an embodiment, each memory point comprises a semiconductor zone and a gate located on the semiconductor zone.

According to an embodiment, the device comprises a conductive area that defines the gates of the memory points.

According to an embodiment, the first and second areas are respectively located on either side of the vertical alignment with the conductive area.

A further embodiment provides an electronic chip comprising one or more devices as defined above.

According to an embodiment, the chip further comprises assemblies each comprising a memory cell and a switch, the assemblies and the devices being disposed in a same matrix, the room occupied by one of the devices being identical to that occupied by two of the assemblies located at adjacent spaces of the matrix.

According to an embodiment, the chip further comprises a circuit configured to select one of the devices and provide a logic value based on a comparison between currents flowing in the first and second switches of the selected device.

According to an embodiment, in each of the devices, only one of the first and second memory points is in a programmed state.

A further embodiment provides a method for programming a device as defined above.

According to an embodiment, the method comprises the temporary application, at the terminals of the association in series, of a voltage for programming the memory points.

A further embodiment provides a method for reading a programmed value in a device as defined above.

According to an embodiment, the method comprises the comparison of a measured resistance value of the association in series with a threshold value.

According to a further aspect, an embodiment provides a device comprising: irreversibly programmable memory points, each comprising a first semiconductor zone and a gate located on the first zone; a conductive area defining the gates of the memory points; and first and second semiconductor areas respectively located on either side of the vertical alignment with the conductive area, the first zones being alternately in contact with the first and second areas.

According to an embodiment, the device comprises, for each of the first zones, a second doped semiconductor zone in electrical contact with the first zone only.

According to an embodiment, an isolating trench separates the first zones.

According to an embodiment, the isolating trench has a width that is less than 300 nm under the conductive area.

According to an embodiment, the device comprises first and second switches respectively connected to the first and second areas.

According to an embodiment, the first and second switches respectively comprise first and second transistors having drain areas respectively defined by the first and second areas.

A further embodiment provides an electronic chip comprising one or more devices as defined above.

According to an embodiment in which the devices are disposed in a matrix, the conductive areas of a row of the matrix form a common conductive area.

According to an embodiment, the chip further comprises: for each of the devices, a third doped semiconductor area connected to the first switch; and additional doped semiconductor zones coupling together the third areas of a row of the matrix.

According to an embodiment, the chip comprises conductive tracks each coupling together controls of the switches of a column of the matrix.

According to an embodiment, the chip comprises a circuit for programming the memory points.

According to an embodiment, the programming circuit is configured to select one of the devices and an area among the first and second areas of the selected device, and to apply temporarily, between the selected area and the conductive area of the selected device, a voltage for the programming of the memory points.

According to an embodiment, the programming circuit is configured so that the programming voltage is supplied by a source external to the chip.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the embodiments described herein have been illustrated and described in detail. In particular, circuits for programming and/or reading memory and circuits for controlling switches are not described in detail, the described embodiments being compatible with conventional circuits for programming and/or reading memory and conventional circuits for controlling switches.

Unless indicated otherwise, when reference is made to two elements that are connected together, this means a direct connection without any intermediate elements other than conductors, and when reference is made to two elements that are linked or coupled together, this means that these two elements may be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
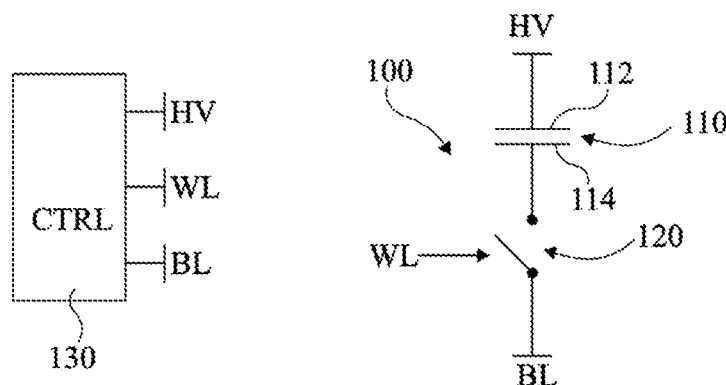
FIG. 1 partially and schematically illustrates a memory of the type to which the embodiments described in the following relate.

FIG. 1 illustrates schematically a memory of the type to which the embodiments described in the following relate. The memory is typically comprised in an electronic chip for integrated circuits.

The memory comprises assemblies 100 (only one of the assemblies is illustrated), each comprising a memory cell 110 and a switch 120 electrically coupled in series between the nodes HV and BL. Preferably, the switch 120 of each assembly 100 has a control terminal coupled to a node WL. The assemblies 100 are typically disposed in a matrix. The node HV is, for example, common to all assemblies 100. The assemblies 100 are connected to a circuit 130 for programming and reading the memory, for example common to all assemblies 100. During operation, the circuit 130 selects one of the assemblies, and programs the cell no of the selected assembly or reads a content of this cell.

For programming and for reading, the circuit 130 applies to the node HV a potential, for example positive, referenced with respect to a reference potential such as the ground. The circuit 130 closes, i.e. renders passable, the switch 120. The circuit 130 applies a potential lower than that of the node HV, for example the reference potential, to the node BL. The result is a voltage applied by the circuit 130 between the nodes HV and BL.

During the programming of the memory cell 110, the voltage applied by the circuit 130 is a programming voltage, i.e. a voltage able to cause, when applied temporarily to the cell no, a permanent modification, preferably irreversible, of a physical property of the memory cell. The physical property is preferably an electrical resistance. Preferably, the memory cell comprises a dielectric between two electrodes 112, 114. The electrode 112 is coupled, preferably connected, to the node HV, and the electrode 114 is coupled, preferably connected, to the switch 120. The programming voltage is thus a voltage exceeding a breakdown voltage of the dielectric. Such a breakdown corresponds, for example, to the creation of an electrically conductive pathway in the dielectric. The temporary application of the programming voltage thus causes an irreversible decrease in the electrical resistance between the electrodes. The memory cell is thus irreversibly programmed.

Preferably, the programming voltage is more than 3 times the voltage applied between the nodes HV and BL in order to read the content of the cell, for example the programming voltage is greater than 5 V, for example greater than 10 V. For instance, the programming voltage is supplied to the circuit 130 by a source external to the electronic chip which comprises the memory and the circuit 130. This source can thus be coupled to the circuit 130 during the unique programming of the memory, and be disconnected from the circuit 130 during reading.

In order to read the content of the memory cell 110, the circuit 130 compares the electrical resistance between the nodes HV and BL with a threshold value. The stored logic value is a function of the result of this comparison. The voltage applied by the circuit 130 is thus less than the breakdown voltage.

Figure 2:
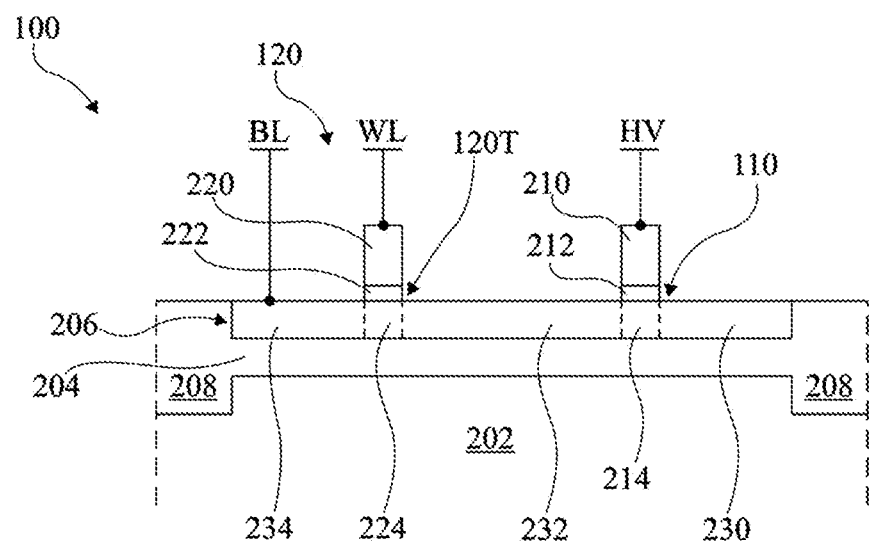
FIG. 2 illustrates a partial and schematic sectional view of a memory of the type to which the embodiments described in the following relate.

FIG. 2 is a partial and schematic sectional view of an example of a memory of the type to which the described embodiments relate. More specifically, the memory comprises assemblies 100 of the type described above in relation to FIG. 1. An assembly 100 is illustrated in FIG. 2.

The memory is formed in and on a front face (upper face) of a, preferably semiconducting, substrate 202, for example made of silicon. Preferably, an electrically insulating layer 204, for example made of silicon oxide, covers the upper face of the substrate 202. The layer 204 is covered with a semiconductor layer 206, for example made of silicon. The substrate 202, the layer 204 and the semiconductor layer 206 thus define an SOI-type structure (Semiconductor On Insulator). Trenches 208 filled with an electrical insulator, for example with silicon oxide, delimit in each assembly 100 a portion of the layer 206. The trenches 208 isolate the portions from each other. The trenches 208 extend, for example, from the front face of the layer 206, through the layers 206 and 204, to a level located in the substrate 202.

The memory cell no comprises a gate 210 and a gate insulator 212 covered by the gate 210, located on a semiconductor zone 214 of the layer portion 206. Preferably, the gate 210, the gate insulator 212 and the zone 214 of the memory cell are disposed in a manner identical or similar to, respectively, a gate, a gate insulator and a zone for the formation of a channel for a field-effect transistor-type structure, for example of an MOS type. The gate 210 is coupled, preferably connected, to the node HV.

The switch 120 comprises an MOS-type field-effect transistor 120T, comprising a gate 220 and a gate insulator 222 covered by the gate 220, located on a semiconductor zone 224 of the layer portion 206. The zone 224 corresponds to the zone for the formation of the channel for the transistor. The gate 220 is coupled, preferably connected, to the node WL.

Preferably, the zones 224 and 214 occupy the layer 206 along its entire thickness. The zones 224 and 214 delimit the areas 230, 232 and 234 in the layer portion 206. The areas 230 and 232 are located on either side of the vertical alignment with the gate 210. The areas 232 and 234 respectively define drain and source areas of the transistor 120T. The source area 234 is coupled, preferably connected, to the node BL. The transistor 120T is preferably N-channel, while the areas 232 and 234 are p-type doped. The area 230 is thus preferably p-type doped.

During operation, when the transistor 120T is passable and a voltage is applied between the nodes HV and BL, the zone 214 of the memory cell 110, rendered conductive by field effect, defines an electrode of the memory cell. The gate 210 defines a further electrode. The gate insulator 212 defines, in the cell memory, a dielectric the breakdown of which corresponds to the irreversible programming of the memory cell.

Although the transistor and the memory cell described here are located in and on an SOI-type structure, the described embodiments are compatible with conventional structures of field-effect transistors. Moreover, the area 214 can be doped with the same type of conductivity as the area 232, and thus define, also in the absence of a field effect, a conductive electrode connected to the doped semiconductor area 232.

Although an assembly comprising a particular memory cell and a particular switch has been described in relation to FIG. 2, the embodiments described in the following are compatible with conventional types of memory cells and switches coupled in series, preferably connected in series.

Figure 3:
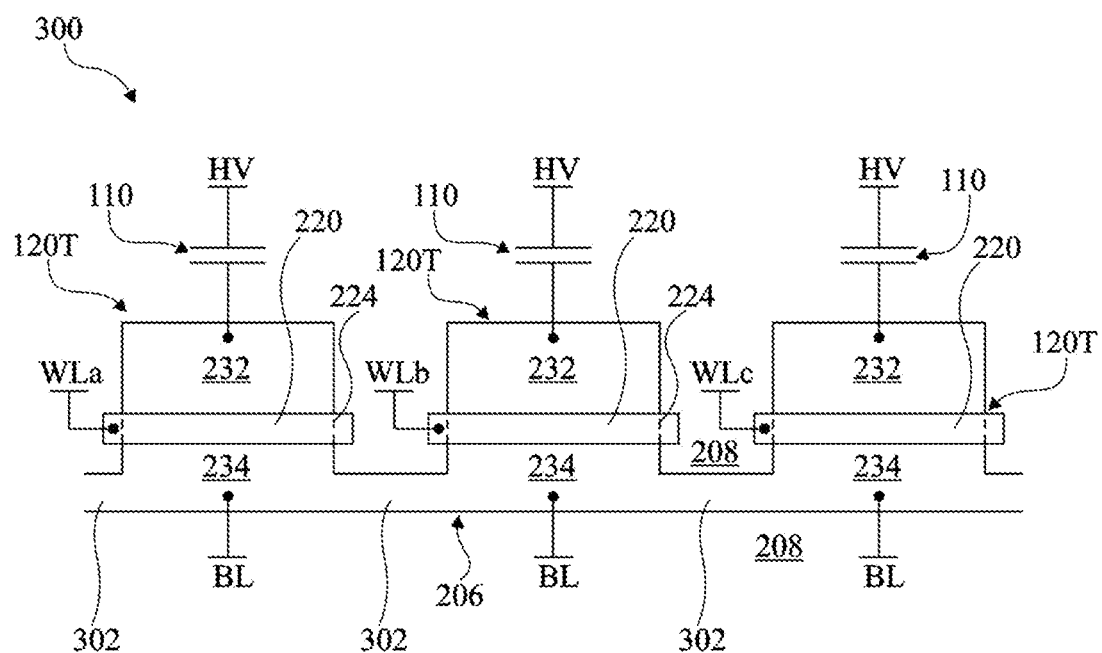
FIG. 3 illustrates a partial and schematic top view of an embodiment of a memory.

FIG. 3 illustrates a partial and schematic top view of an embodiment of a memory. More specifically, FIG. 3 illustrates a device 300 comprising a plurality of memory cells 110, preferably at least three memory cells 110. The cells no are, for example, in a row of a matrix of memory cells. The device 300 corresponds, for example, to a row of the matrix. Each cell no is preferably coupled in series, for example connected in series, to a transistor 120T as described above in relation to FIG. 2. Thus, each transistor comprises, when viewed from above, source areas 232 and drain areas 234 on either side of a gate 220. The source areas 232 and drain areas 234 are preferably parts of a same semiconductor layer portion 206 delimited by trenches 208.

In the present embodiment, the source areas 234 of the transistors 120T of the device 300 are all connected between one another by semiconductor areas 302. The areas 302 are doped with the same type of conductivity as the source areas 234, preferably n-type doped. Preferably, the areas 302 are parts of the layer 206. The doping level of the areas 302 is preferably in the order of the doping level of the source areas 234, for example the doping levels of the areas 302 and 234 are identical. The areas 302 and 234 of all transistors of the device 300 thus form a single doped semiconductor area.

Preferably, the sources 234 of the transistors are coupled to a common node BL. The node BL is preferably defined by a semiconductor track not shown here. This conductive path is parallel to the row direction. This conductive track is located in insulating layers covering the front face.

For instance, the gates 220 of the transistors are coupled to separate nodes, preferably each defined by a separate semiconductor track WLa, WLb, WLc not shown here. Each of the conductive tracks WLa, WLb and WLc is, for example, parallel to a column direction of the matrix. These conductive tracks are located in insulating layers covering the front face.

An attacker may try to read the content of the memory cells no. To this end, the attacker can remove the elements of the memory located above (at the front in the figure) the transistors, such as the conductive tracks, in order to gain direct access to the transistors and to the memory cells. These elements are typically removed by ion beam etching. The attacker then uses, for example, conducting tips that he connects to the gates and to the semiconductor areas. However, even if the conductive tracks have been removed, the source areas 234 of the transistors remain electrically connected by the areas 302. Distinguishing between the different contents of the adjacent memory points is thus, for the attacker, more difficult in a memory comprising the device 300 than in a memory without the areas 302. Thus, a memory comprising the device 300 ensures a level of protection for the data it contains that is higher than in the case of a memory without the areas 302.

The gate 220 of each transistor 120T preferably has an elongated shape, for example rectangular when viewed from above. The elongation of this shape is in a width direction of the transistor, i.e. a direction orthogonal to the drain-source direction. The elongated shapes of the gates 220 of the transistors 120T of the device 300 are preferably collinear, i.e. disposed along a same axis parallel to the rows of the matrix and elongated in the direction of the axis. When viewed from above, the long sides of the rectangle shapes of the gates 220 of the transistors are collinear. Thus, the width direction of the transistors corresponds to a row direction of the matrix. The source areas 234 are thus located, when viewed from above, all on the same side of the gates 220 of the transistors. It is thus possible to give the areas 302 a particularly simple shape, for example rectangular.

As a variant, the width directions of the transistors can be any direction, for example a column direction of the matrix, and the areas 302 can have any shape that makes it possible to connect together all the source areas of the transistors of the device 300.

As a variant, each transistor 120T is replaced by two transistors coupled in series, preferably connected in series, and each track WLa, WLb, WLc is replaced by two tracks each coupled, preferably connected, to one of the two transistors. During operation, in order to close a switch 120 formed by two of the transistors connected in series in this way, potentials between that of the ground and that of the node HV are applied to the two tracks in question. These potentials are chosen so as to limit the voltage to which the gate insulator of each of the two transistors is subjected. It is thus possible to realize the two transistors in a simpler fashion than transistors that resist the programming voltage between their gate and their drain/source areas. The gates of the transistors thus preferably have elongated shapes in a same direction. Similarly, in a further variant, each switch 120 comprises more than two transistors. Each track WLa, WLb, WLc is then replaced by as many tracks as there are transistors in each switch.

Figure 4:
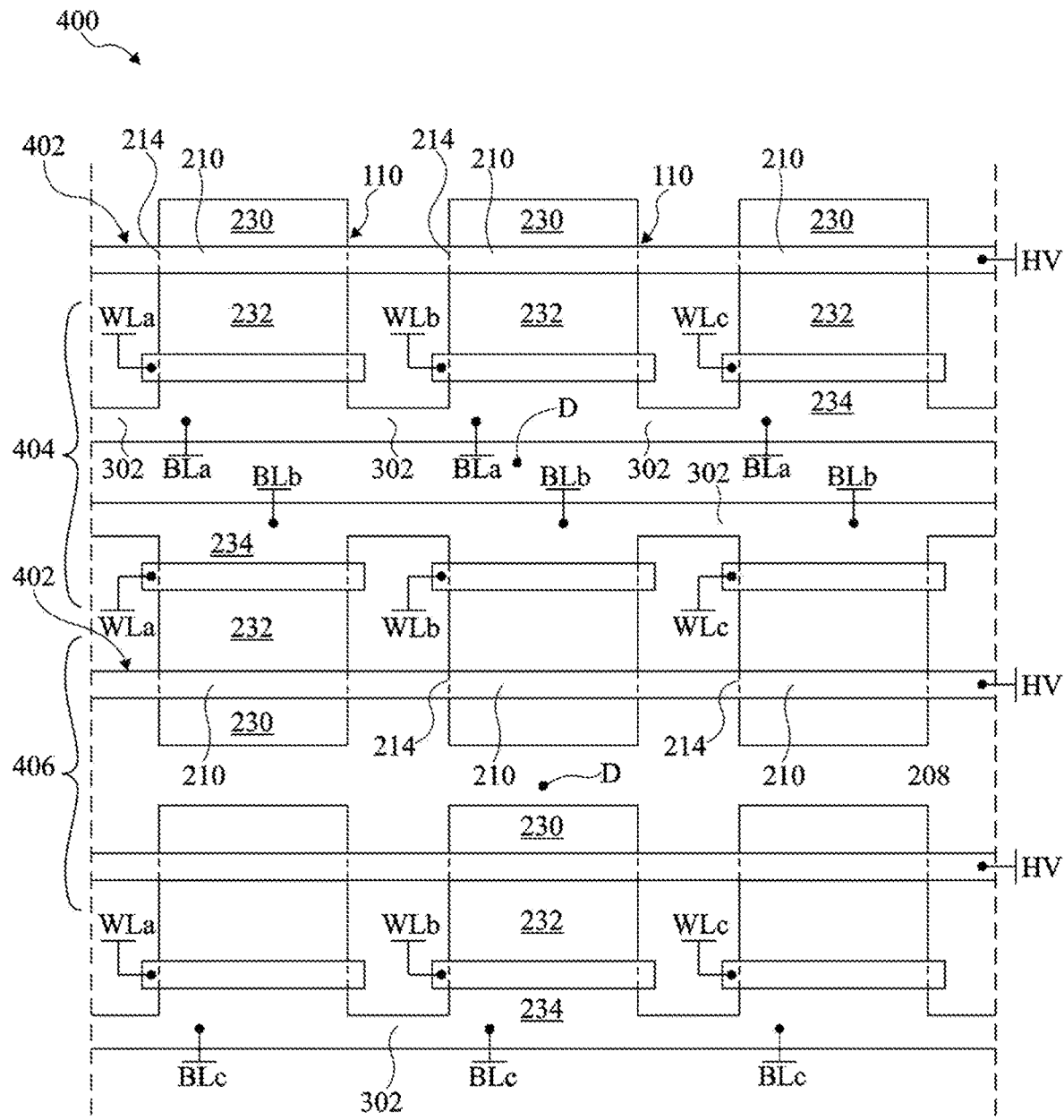
FIG. 4 illustrates a partial and schematic top view of an embodiment of a memory.

FIG. 4 illustrates a partial and schematic top view of an embodiment of a memory comprising devices 300 as shown in FIG. 3. More specifically, each device 300 constitutes a row of the matrix. Although three rows are illustrated, the matrix can also comprise two rows or more than three rows. In this embodiment, each memory cell comprises a field-effect transistor-type structure as described in relation to FIG. 2. Thus, each memory point comprises a gate 210 covering a zone 214 in contact with the area 232 in question.

The gates 210 of the memory points of each row constitute a common conductive area 402. Preferably, the common conductive area 402 has the shape of a ribbon when viewed from above. The ribbon is preferably rectilinear and has as its main direction the direction of the rows. The conductive area 402 is coupled to the node HV. In each row, the source areas 234 of the transistors are coupled to a conductive track BLa, BLb, BLc connecting all areas 234 of the row between them.

The conductive area 402 and the gates 220 of the transistors have the shapes, when viewed from above, respectively of a ribbon and of rectangles, elongated in the same direction. This direction is, in the example shown, that of the rows. As a result, the gates 402 and 220 are easy to realize by conventional manufacturing methods for transistor gates.

Preferably, the adjacent rows of the matrix are disposed symmetrically in relation to axes D orthogonal to the front face (the axes D are orthogonal to the plane of the figure and have been illustrated by dots). The adjacent rows are, for example, disposed symmetrically in relation to planes transecting the axes D (not illustrated) and parallel to the direction of the rows. Thus, the transistors 110 of two adjacent rows are located in a strip 404 and the memory cells 406 of two adjacent rows are located in a strip 406.

Figure 5:
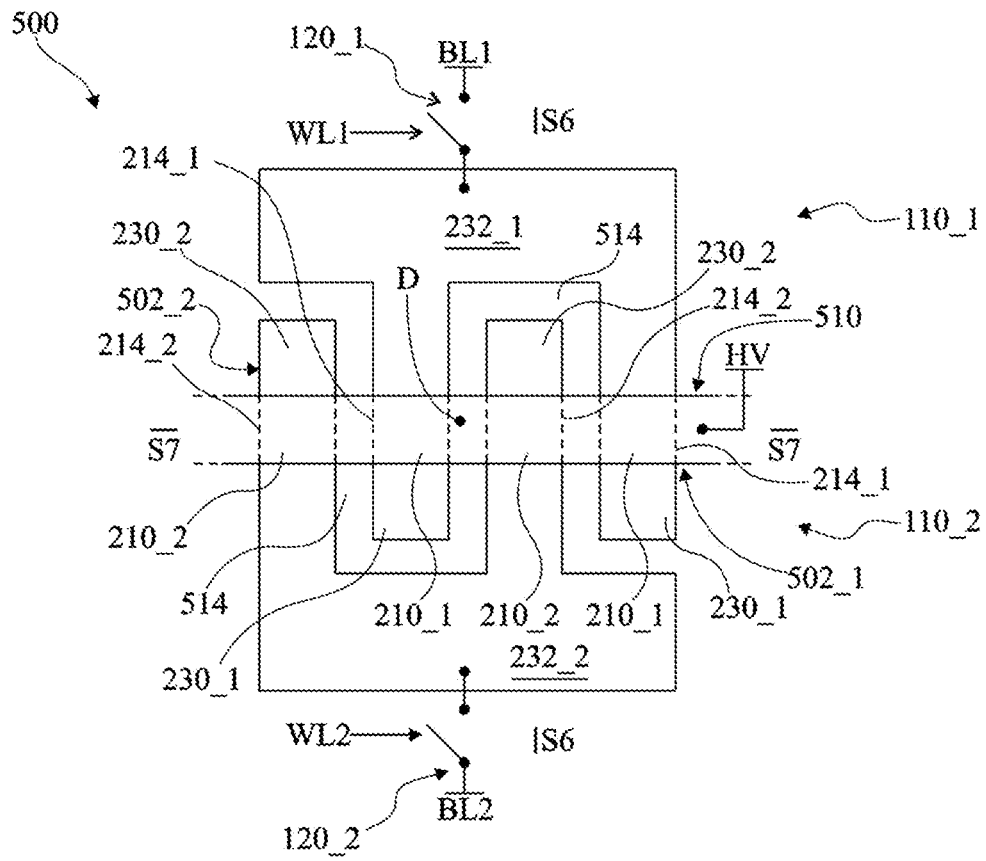
FIG. 5 illustrates a partial and schematic top view of an embodiment of a device comprising memory cells.
Figure 6:
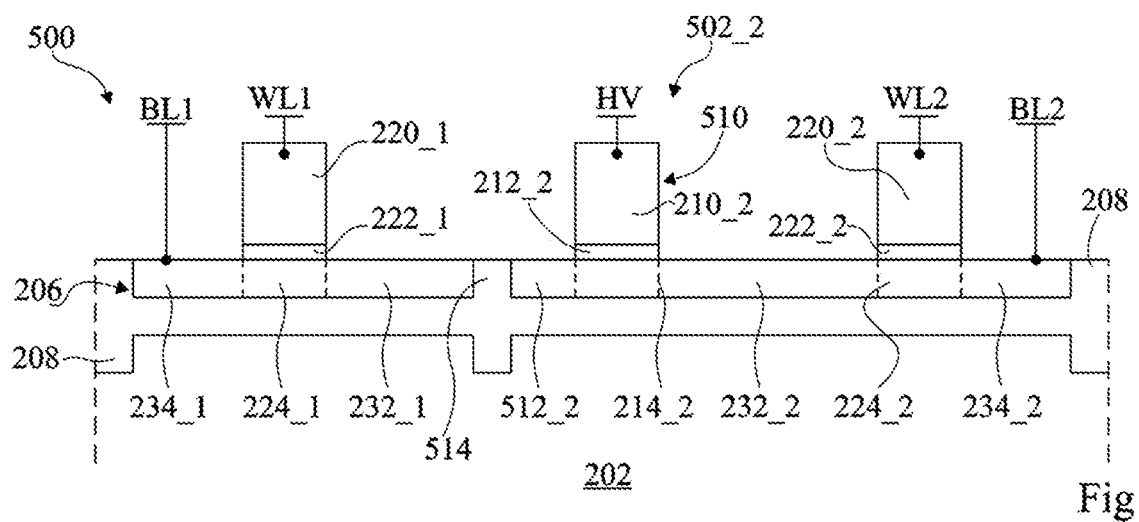
FIG. 6 illustrates a partial and schematic sectional view of the embodiment shown in FIG. 5.
Figure 7:
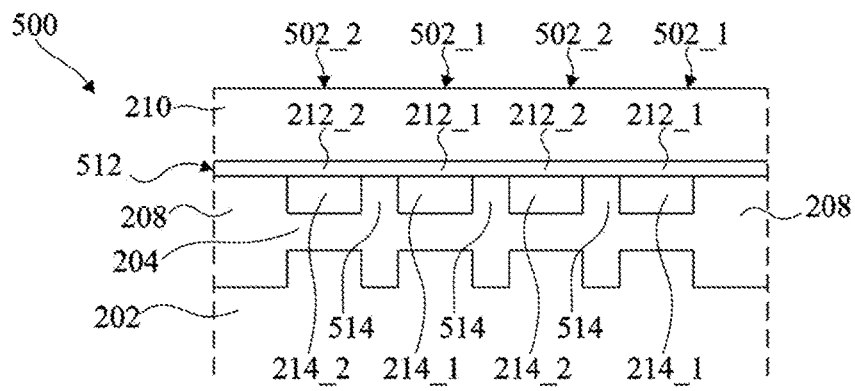
FIG. 7 illustrates a further partial and schematic sectional view of the embodiment shown in FIG. 5.

FIGS. 5, 6 and 7 illustrate partial and schematic views of an embodiment of a device 500 comprising memory cells, respectively viewed from above, sectioned along a plane S6-S6, and sectioned along a plane S7-S7. More specifically, the device 500 comprises two memory cells 110_1 and 110_2. The memory cells 110_1 and 110_2 are preferably adjacent in a matrix of memory cells. The memory cells are, for example, symmetrical with respect to each other in relation to an axis D orthogonal to the front face.

Each memory cell comprises a doped semiconductor area, respectively 232_1, 232_2. The areas 232_1 and 232_2 are coupled, preferably connected, to respective nodes BL1 and BL2 by respective switches 120_1 and 120_2.

The switches 120_1 and 120_2 are illustrated schematically in FIG. 5. The switches 120_1 and 120_2 have their control terminals coupled respectively to nodes WL1 and WL2. The switches are preferably of the same type as the switch 120 described above in relation to FIGS. 1 and 2. In particular, the switches 120_1 and 120_2, as schematically illustrated in FIG. 6, comprise elements identical or similar to those of the switch 120 shown in FIG. 2, arranged in a similar or identical manner. Thus, each switch 120_1, 120_2 comprises a conductive gate, respectively 220_1, 220_2, disposed on a gate insulator, respectively 222_1, 222_2, covering a semiconductor zone, respectively 224_1, 224_2. Each zone 224_1, 224_2 is located between a source area, respectively 234_1, 234_2, and the respective area 232_1, 232_2. The gate 220_1 is coupled, preferably connected, to the node WL1, and the area 234_1 is coupled to the node BL1. The gate 220_2 is coupled, preferably connected, to the node WL2, and the area 234_2 is coupled to the node BL2.

In the cell 110_1, the area 232_1 is in contact with one or more (two in the example shown) semiconductor zones 214_1. Each zone 214_1 is located under a conductive gate 210_1, and separated from the gate 210_1 by a gate insulator 212_1. Each gate insulator 212_1 is in contact with the gate 210_1 and the zone 214_1 in question. The thus obtained stack of the zone 214_1, the gate insulator 212_1 and the gate 210_1, is configured in such a manner that a temporary application of a programming voltage between the gate 210_1 and the area 232_1 triggers the breakdown of the gate insulator, in a manner similar to the one described for the cell 110 shown in FIG. 2. The stack thus corresponds to a memory point 502_1.

In the cell 110_2, the area 232_2 is in contact with one or more (two in the example shown) semiconductor zones 214_2. The number of zones 214_2 can be different from, or equal to, the number of zones 214_1. As with the zones 214_1, each zone 214_2 is located under a semiconductor gate 210_2, and separated from the gate by a gate insulator 212_2. The gate insulator(s) 212_2 are in contact with the gate(s) 210_2 and the zone(s) 214_2. The stacks of the zones 214_2, insulators 212_2 and gates 210_2 are configured in the same manner as for the cell 110_1, so as to correspond to memory points 502_2.

The gates 210_1 and 210_2 are aligned and are alternated parts of the same conductive area 510. The zones 214_1 and 214_2 are aligned and alternated under the area 510. The conductive area 510 preferably has an elongated shape in the form of a strip in the direction of alignment of the gates 210_1 and 210_2, and thus of the zones 214_1 and 214_2. Thus, the area 510 passes successively along one of the zones 214_1 and then one of the zones 214_2, preferably repeatedly. Preferably, when viewed from above, each of the gates 210_1 and 210_2 and zones 214_1 and 214_2 substantially occupies the width of the strip. When viewed from above, the conductive area 510 covers the space between the doped semiconductor areas 232_1 and 232_2.

Preferably, each zone 214_1 is in contact with a semiconductor zone 230_1 located on a side of the zone 214_1 opposite the area 232_1. Preferably, each zone 214_2 is in contact with a semiconductor zone 230_2 located on a side of the zone 214_2 opposite the area 232_2. Preferably, the areas 232_1, 232_2 and the zones 230_1, 230_2 are of the same conductivity type, for example n-type, and have the same doping level.

The entirety of the area 232_1 and of the zones 214_1 and possibly 230_1 is isolated from the entirety of the area 232_2, the zones 214_2 and possibly 230_2. This isolation is realized in particular by an isolation trench 514. The trench 514 comprises at least one portion located under the area 510.

Preferably, the areas 232_1, 232_2, and the zones 214_1, 214_2, 230_1 and 230_2 are parts of a same semiconductor layer 206, visible in FIG. 6, for example with an SOI-type structure. Preferably, the source areas 234_1, 234_2 of the transistors are also pails of the layer 206. The isolation trenches 208 surround the layer portion 206 in and on which the device 500 is located. Preferably, the trench 514 has the same depth as the trenches 208. The gate insulators 212_1 and 212_2 have a same breakdown voltage. For this purpose, preferably, the gate insulators 212_1 and 212_2 are parts of a same insulating layer 512 (FIG. 7).

In order to program the cell 100_1, the switch 120_1 is closed by applying a control potential of the switch to the node WL1. A programming voltage that exceeds the breakdown voltage of the insulators is applied. The zone(s) 214_1 are conductive, or become conductive by field effect due to the voltage applied between the gate 210_1 and the area 232_1. This triggers a breakdown of at least one of the insulators 212_1. The programming of the cell 110_2 is similar to that of the cell 120_1.

In order to read the content of the cell 110_1, the switch 120_1 is closed, and a resistance value of the association in series of the switch 120_1 and of the cell 110_1 is compared to a threshold value. The reading of the content of the cell 110_2 is similar to that of the cell 110_1.

An attacker may try to read the content of the memory cells 110_1 and 110_2 of the device 500. For this purpose, the attacker can remove the elements of the memory located above (at the front in the figure) of the area 510 defining the memory point gates 502_1, 502_2, for example by means of an ion beam. However, even if the attacker manages to connect a conducting point to the conductive area 510, he cannot apply different potentials to the gate(s) 210_1 of the cell 110_1 and to the gate(s) 210_2 of the cell 110_2. Thus, it is difficult for the attacker to distinguish between the different contents of the cells 110_1 and 110_2. Consequently, the memory cells of the device 500 have a level of protection of their content that is higher than memory cells that do not comprise memory points the gates of which are defined by a common conductive area.

Moreover, the trench 514 preferably has, in the direction of elongation of the area 510 (longitudinal direction of the strip shape of the area 510), a modest width, i.e. less than approximately 500 nm, for example less than 500 nm, even more preferably less than approximately 300 nm, for example less than 300 nm. Preferably, the width is less than the diameter of the ion beam potentially used by the attacker. Even if the attacker attempts, in order to separate the gates 210_1, 210_2 from each other, to use the ion beam to remove the part(s) of the area 510 located on the trench 514, he will not succeed in separating the gates 210_1, 210_2 without risking also removing a part of the gates 210_1, 210_2 and rendering the contents of the memory points 502_1, 502_2 unreadable. This enables a particularly high level of protection of the data contained in the cells.

Preferably, in cases where the memory cell 110_1 comprises a plurality of memory points, the programming voltage is applied in such a manner that, when one of the gate insulators 212_1 breaks down, this triggers a decrease in the voltage applied to the other gate insulator(s) 212_1 sufficient to avoid their breakdown. For instance, a resistor in series with the switch 120_1 and the memory cell 110_1 is provided, capable of causing this decrease in voltage upon a breakdown. Thus, only one of the memory points of the cell is programmed. As a variant, any other method can be used for breaking only one of the gate insulators 212_1. Preferably, in cases where the memory cell 110_2 comprises a plurality of memory points, the memory cell is programmed in the same manner as for the cell 100_1, by ensuring that only one of the gate insulators 212_2 breaks down.

Since, in each cell 110_1, 110_2, the memory points of the cell are associated in parallel between the node HV and the area 232_1, 232_2, the programming of only one of the gate insulators is sufficient to decrease the resistance of the memory cell. It is thus possible by means of the comparison of this resistance to a threshold value to read a value programmed in the memory cell.

If an attacker succeeds in determining that one of the memory points 502_1, 502_2 has not been programmed, he cannot infer that the memory cell 110_1 or 110_2 in question has not been programmed. The attacker must succeed in reading the content of all memory points of a cell in order to infer from the same the content stored in the cell. Thus, the work of the attacker is all the longer and all the more difficult, and the level of protection of the data is all the higher, the greater the number of memory points per memory cell.

Figure 8:
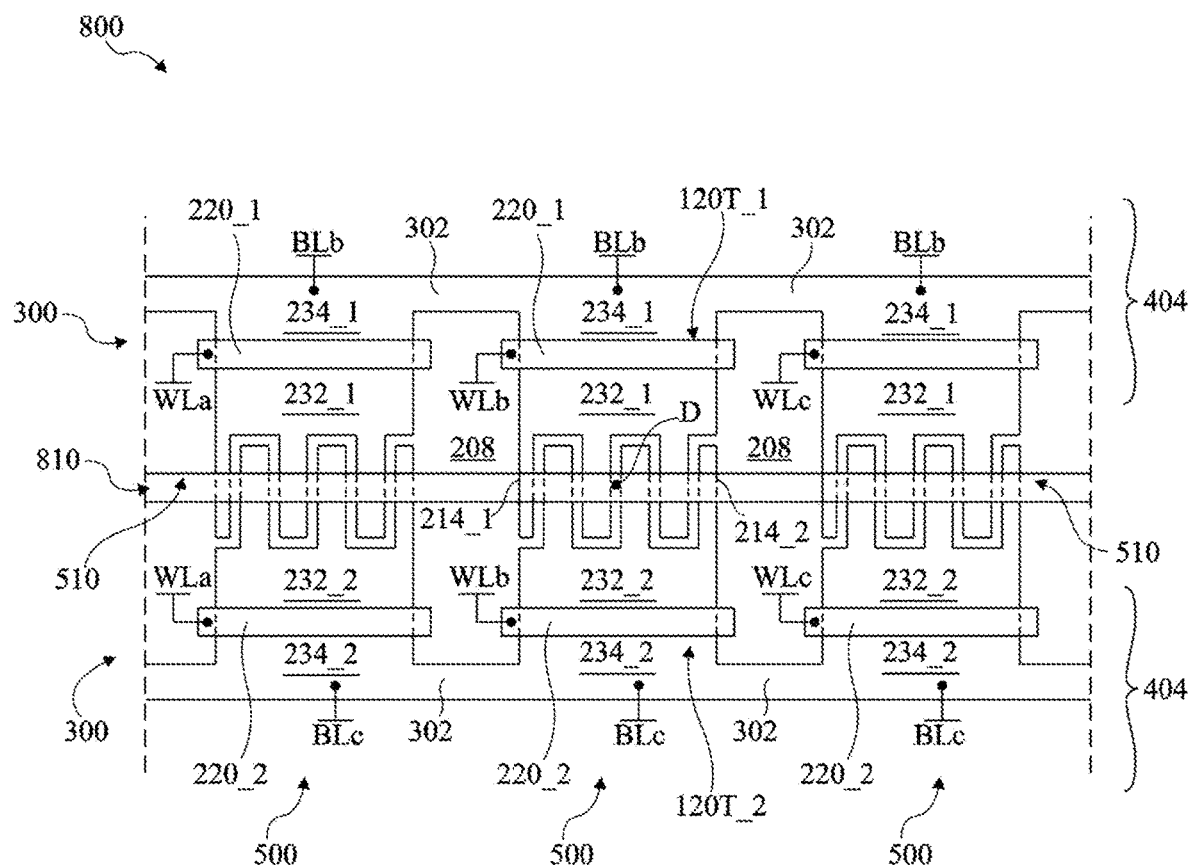
FIG. 8 illustrates a partial and schematic top view of an embodiment of a memory.

FIG. 8 illustrates a partial and schematic top view of an embodiment of a memory 800. More specifically, the memory 800 comprises devices 500 of the type shown in FIGS. 5, 6 and 7, and devices 300 of the type shown in FIG. 3. For instance, three devices 500 are illustrated.

The devices 500 are located in two adjacent rows of a matrix of memory cells. The switches 120_1 are identical or similar to those of a device 300 of the type shown in FIG. 3, and arranged in an identical or similar manner. In particular, the switches 120_1 comprise transistors 120T_1 the source areas 234_1 of which are connected between one another by areas 302. The switches 120_2 are identical or similar to those of a device 300 of the type shown in FIG. 3, and arranged in an identical or similar manner. Likewise, the switches 120_2 comprise transistors 120T_2 the source areas 234_2 of which are connected between one another by areas 302.

Preferably, the two adjacent rows shown are symmetrical with respect to each other in relation to an axis D orthogonal to the front face. Preferably, the memory comprises, on either side of the illustrated rows, further rows similar to the illustrated rows. Each device 300 is thus preferably comprised in a strip 404 as defined in relation to FIG. 4.

Preferably, the two cells of each of the devices 500 are located in the same column of the matrix. In each device 500, the gates 220_1 and 220_2 are coupled between each other, preferably by lines WLa, WLb, WLc as defined in relation to FIG. 4.

Since the memory 800 simultaneously comprises a device 300 and a device 500, it offers a particularly high level of protection against the reading of the contents by an unauthorized person.

Preferably, the conductive areas 510 that define the gates 210_1 and 210_2 of the memory points constitute a common conductive area 810. The area 810 preferably has an elongated shape in the direction of the trenches, for example, when viewed from above, a strip shape extending in the direction of the rows.

Thus, the area 810 electrically connects all gates of the memory points of the two adjacent rows between one another. This represents an additional difficulty for an attacker trying to obtain the contents of the memory. It is thus possible by means of the provision of the common area 810 to improve the level of protection against the reading of the contents of the memory by an unauthorized person.

Although specific examples of the switches 120_1 and 120_2 have been described, these switches can be those of, or be replaced by, any circuit configured for the selection of one of the memory cells of the matrix and for programming and/or reading the data in the selected cell. For example, a memory can be realized that comprises the same elements as those of the memory 800, arranged in an identical manner, with the difference that areas 302 are not provided. For instance, the areas 234_1 and 234_2 of a same column of the matrix are thus connected between one another by a track, and the gates 220_1 or 220_2 of a same row of the matrix are connected between one another by a track, or, preferably, constitute a common conductive area.

Figure 9:
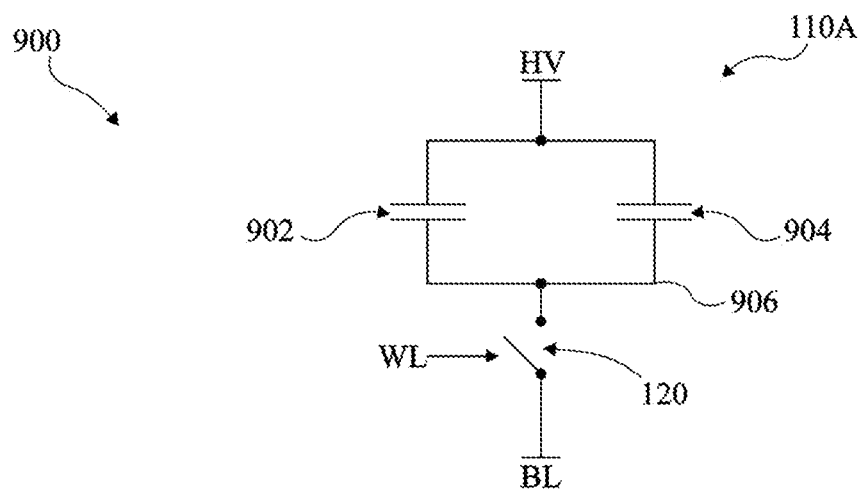
FIG. 9 illustrates schematically an embodiment of a device comprising a memory cell.

FIG. 9 illustrates schematically an embodiment of a device 900 comprising a memory cell 110A.

The memory cell 110A comprises two irreversibly programmable memory points 902 and 904, electrically associated in parallel between a node 906 and a node HV. This association in parallel and a switch 120 are coupled in series, preferably connected in series, between nodes HV and BL for the application of a programming voltage.

Preferably, the electrical resistance of each memory point 902, 904 is lower after programming than before programming. Preferably, each memory point comprises a dielectric, the programming of the memory point being achieved by the breakdown of the dielectric. The dielectrics preferably have a same breakdown voltage.

In order to program the cell 110A, the programming voltage is preferably applied in such a manner that the decrease in resistance of one of the memory points at the moment of its programming triggers a decrease in the voltage at the terminals of the other memory point that is sufficient to prevent the programming of the other memory point. This can be achieved, for example, by electrical resistances of the conducting elements that define the node 906, and/or of the switch 120 in a passable state, and/or, for example, of resistor elements external to the device 900. Only one of the memory points 904 and 906 is thus programmed in the memory cell. Since the programming voltage is applied in parallel at the two memory points, the only memory point programmed in the cell is randomly one or the other of the memory points 902, 904. The programming voltage can be applied in any other manner by means of which it is possible to limit the probability that the two memory points are programmed simultaneously.

It can be provided that a plurality of electronic chips are realized, each comprising one or more devices 900 and, preferably, a memory. The devices 900 of the various chips are, for example, identical. The devices 900 of the chips are then programmed. After programming, the programmed memory points 902 or 904 are different in the different chips.

It is further possible to provide, in each chip, a read circuit configured to supply, for each device 900, a value with a first logic level if one of the memory points has been programmed and a second logic level if the other memory point has been programmed. A particular example of a circuit supplying such a value using a device 900 is described below in relation to FIG. 11. Each of the values supplied by the read circuit constitutes, for example, a bit of a unique code for each chip, this code corresponding to a physically unclonable function. Preferably, each chip uses this code to encrypt the data stored in its memory.

Thus, by means of this programming, performed in the same manner on the various devices 900, it is possible to randomly program in each device one or the other of the memory points 902, 904. The bits of the physically unclonable function can thus be defined in the chip without providing the chip with information, such as random logic levels, originating at a device external to the chip and permitting a definition of these bits. An unauthorized person wishing to decrypt the data stored in the memory of the chip would not be able to obtain the unique code of the chip using the external device or a communication link between the external device and the chip. As a result, a chip using devices 900 to generate a physically unclonable function has a particularly high level of protection against the reading of the data by an unauthorized person.

Figure 10:
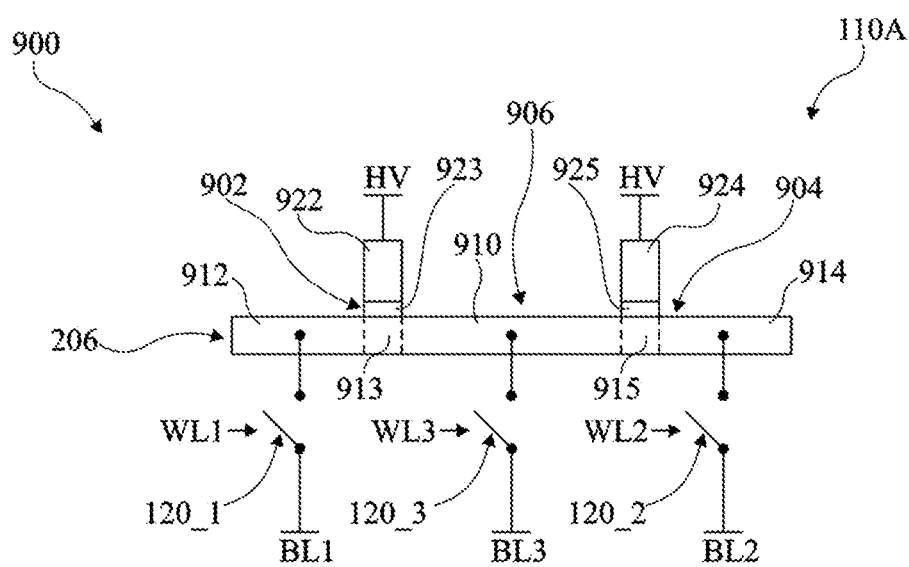
FIG. 10 illustrates a partial and schematic sectional view of an example of a device of the type shown in FIG. 9.

FIG. 10 illustrates a partial and schematic sectional view of an example of a device of the type of device 900 shown in FIG. 9.

The connection node 906 comprises a doped semiconductor area 910 connecting the memory points 902 and 904. The area 910 is, for example, n-type doped. Preferably, each memory point 902, 904 comprises a respective gate 922, 924 on a respective gate insulator 923, 925, covering a semiconductor zone 913, 915. The zones 913 and 915 are preferably in contact with the area 910.

The operation of the memory points 902 and 904 is similar to that of the memory points 502_1 and 502_2 described in relation to FIG. 5, specifically in that the programming of the memory point is achieved by the breakdown of the gate insulator by applying a programming voltage between the nodes HV and 906, the zones 913 and 915 being conductive, or rendered conductive by field effect. Preferably, the area 910 and the zones 913 and 915 are parts of a same semiconductor layer 206 as defined in relation to FIG. 2.

The device further comprises a doped semiconductor area 912. The area 912 is electrically connected to the zone 913. The area 912 is preferably separated from the area 910, the areas 910 and 912 thus being separated by the zone 913. Preferably, the area 912 is in electrical contact with the area 913 only. For instance, the area 912 is located on the side of the area 913 opposite the area 910. The areas 910 and 912 are thus located on either side of the vertical alignment with the gate 922. The area 912 is preferably a part of the layer 206. The areas 910 and 912 have, for example, the same doping type and the same doping level.

Preferably, the device comprises a doped semiconductor area 914 electrically connected to the zone 915. The area 914 is preferably separated from the area 910, the areas 910 and 914 thus being separated by the zone 915. Preferably, the area 912 is in electrical contact with the area 913 only. For instance, the area 914 is located on the side of the area 915 opposite the area 910. The areas 910 and 914 are thus located on either side of the vertical alignment with the gate 924. The area 912 is preferably a part of the layer 206. The areas 910, 912 and 914 have, for example, the same doping type and the same doping level.

The device comprises a switch 120_1 connected between the area 912 and a node BL1. More specifically, in the layer 206, only the area 912 or a part of the area 912 is electrically in series with the switch 120_1 and the zone 913 between the memory point 902 and the node BL1.

Preferably, the device comprises a switch 120_2 connected between the area 912 and a node BL2. More specifically, in the layer 206, only the area 914 or a part of the area 914 is electrically in series with the switch 120_2 and the zone 915 between the memory point 904 and the node BL2.

Preferably, the device comprises a switch 120_3 connected between the area 910, for example a central part of the area 906, and a node BL3. More specifically, in the layer 206, only a part of the area 910 is electrically in series with the zone 913 and the switch 120_3 between the memory point 902 and the node BL3. Likewise, in the layer 206, only a part of the area 910 is electrically in series with the zone 915 and the switch 120_2 between the memory point 904 and the node BL3. Preferably, the switch 120_3 is located symmetrically between the doped zones 913 and 915, that is to say that the parts of the area 910 that are electrically in series between the switch and the memory points are symmetrical.

In order to program one or the other of the memory points, the programming voltage is preferably applied between the nodes HV and BL3, and the switch 120_3 is rendered passable. As a variant, the programming voltage can be applied between the nodes HV and BL1 and the switch 120_1 rendered passable. In this variant, the switch 120_3 can be omitted.

In order to obtain a value stored in the device 900, for example a bit value of a physically unclonable function, the switch 120_1 is closed. The electrical resistance between the nodes HV and BL1 is compared to a threshold value. If the programmed memory point is the memory point 904, the resistance between the nodes HV and BL1 is higher than if the programmed memory point is the memory point 902. The difference in resistance when the memory point 904 or 902 is programmed stems in particular from the electrical resistance of the areas 910 and 913. In particular the form and level of doping in the area 910 is chosen so as to obtain a difference in resistance by means of which it is possible to discern which of the memory points 902 and 904 has been programmed. Moreover, although the area 910 only has one doping level in this example, parts of the area 910 can be provided with different doping levels.

As a variant, in cases where the switch 120_3 is provided, the switch 120_1 can be omitted. At least one of the memory points 902 and 904 is programmed, and a stored value can be read by comparison with a threshold value of the association in series of the switch 120_3 and of the memory cell 110A.

Figure 11:
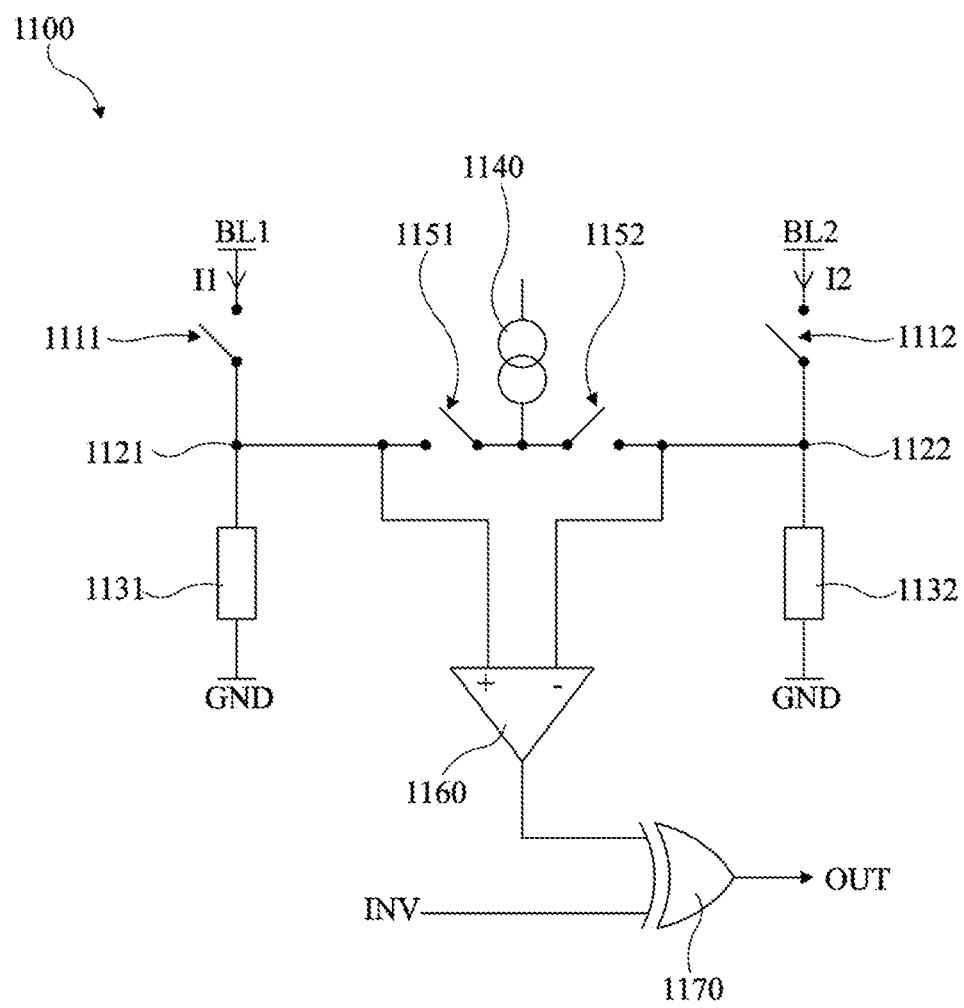
FIG. 11 illustrates schematically a circuit for reading the content of a memory cell.

FIG. 11 illustrates schematically a circuit 1100 for reading the content of the memory cell 110A of the device 900 shown in FIG. 10. More specifically, the read circuit 1100 provides the value of a physically unclonable function bit, in the example where the switch 120_2 is provided in the device 900. The circuit 1100 is coupled, preferably connected, to the nodes BL1 and BL2.

The circuit 1100 comprises a switch 1111 coupling the node BL1 to a node 1121, and a resistor element 1131 coupling, preferably connecting, the node 1121 to a node for applying a reference potential, for example the ground GND. The circuit 1100 further comprises a switch 1112 coupling the node BL2 to a node 1122, and a resistor element 1132 coupling, preferably connecting, the node 1122 to the ground. The circuit 1100 further comprises a current source 114o coupled to the nodes 1121 and 1122 by respective switches 1151 and 1152. The nodes 1121 and 1122 are coupled to the respectively non-inverting (+) and inverting (−) inputs of a comparator 1160. The comparator has its output coupled to an input of a logic gate or Exclusive 1170 a second input of which receives a signal INV.

During operation, a voltage that is lower than the breakdown voltage of the gate insulators of the memory points 902 and 904 is applied between the node HV and the ground.

In a first working embodiment of the circuit 1100, the switches 1151 and 1111 are passable, and the switches 1152 and 1112 are open. The signal INV is at a low logic level. A high signal OUT is thus obtained at the output of the logic gate 1170 when a current I1 flowing from the node BL1 is greater than a threshold value corresponding to the current drawn by the source 1140. The signal OUT is low if the current I1 is lower than the threshold value. The output OUT thus has high logic level when the programmed memory point is the memory point 902 and a low logic level when the programmed memory point is the memory point 904.

In a second working embodiment of the circuit 1100, the switches 1152 and 1112 are passable, and the switches 1151 and 1111 are open. The signal INV is at a high logic level. The signal OUT is high when a current I2 flowing from the node BL2 exceeds the threshold value. The signal OUT is low if the current I2 is lower than the threshold value. The output OUT thus has the high logic level when the programmed memory point is the memory point 904 and the low logic level when the programmed memory point is the memory point 902.

Thus, in the first and second working embodiments, the circuit supplies the value of a bit of a physically unclonable function.

In a third working embodiment, the switches 1151 and 1152 are open, and the switches 1111 and 1112 are passable. The signal INV is at a low logic level. When the current I1 flowing from the node BL1 has a value exceeding that of the current I2 flowing from the node BL2, the obtained signal OUT is at the high logic level. When the current I1 has a value that is lower than the value of the current I2, the obtained signal OUT is at the low logic level. The output OUT thus has the high logic level when the programmed memory point is the memory point 902, and the low logic level when the programmed memory point is the memory point 904.

In the third working embodiment, the circuit 1100 provides the same physically unclonable function value as the first and second working embodiments. The third working embodiment further presents the advantage of comparing the currents in the memory points 902 and 904 with each other. It is thus possible to avoid changes in the read value due to a variation of the resistance of the programmed memory point 902 or 904 or of the threshold value with which this resistance is compared. There is a risk of such variations occurring, for example, when the temperature changes. One thus avoids the risk that data encrypted by means of the unclonable function become indecipherable due, for example, to a change in temperature.

According to further advantage of the third working embodiment, the sum of the currents I1 and I2 flowing in the memory points 902 and 904 is substantially the same if the programmed memory point is the memory point 902 and if the programmed memory point is the memory point 904. It is thus possible to prevent an attacker from being able to infer the physically unclonable function value based on a measurement of a current supplied by a power supply.

According to an advantage of the circuit 1100, each node BL1 and BL2 can be coupled, preferably connected, to a memory cell no (FIG. 1) by a switch 120 (FIG. 1). By means of the circuit 1100, it is thus possible to read the contents of the memory cells no coupled to the nodes BL1 and BL2 in the respective first and second working embodiments when the switches 120_1 and 120_2 of the device are open and the switch 120 connected to the memory cell to be read is closed. A same circuit 1100 can thus be used to read contents of memory cells no and/or provide physically unclonable function bits.

In relation to FIG. 11, a particular read circuit 1100 was described. In order to provide a physically unclonable function bit using the device 900, the circuit 1100 can be replaced by any circuit with which it is possible to:

compare a resistance R1 of the association in series of the switch 120_1 and of the association in parallel of the memory points 902 with a threshold value; and/or compare a resistance R2 of the association in series of the switch 120_2 and of the association in parallel of the memory points 902 with a threshold value; and/or compare the resistances R1 and R2, for example by applying a voltage between the terminals HV and BL1 and between the terminals HV and BL1, with each other, and by comparing the values of the currents I1 and I2 flowing in the switches 120_1 and 120_2.

Figure 12:
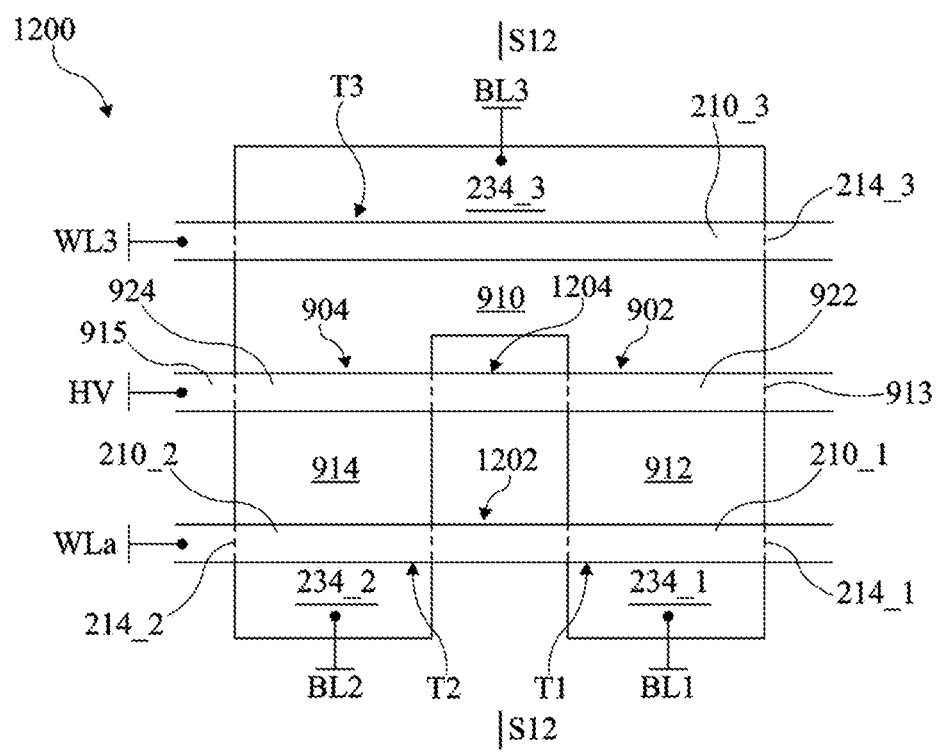
FIG. 12 illustrates a partial and schematic top view of an example of a device of the type shown in FIG. 9.

FIG. 12 illustrates a partial and schematic top view of an example of a device 1200 of the same type as the device 900 shown in FIG. 9. The device 1200 comprises the same elements as those of the example shown in FIG. 10, arranged in an identical or similar manner, with the difference that the nodes WL1 and WL2 of the example shown in FIG. 10 are replaced by a common node WLa.

The switch 120_1 comprises a transistor T1 including a source area 234_1 in contact with a doped semiconductor zone 214_1 and located under a conductive gate 210_1. The area 912 defines a drain area of the transistor T1. The switch 120_2 comprises a transistor T2 comprising a source area 234_2 in contact with a doped semiconductor zone 214_2 and located under a conductive gate 210_2. The area 914 defines a drain area of the transistor T1. The switch 120_3 comprises a transistor T3 including a source area 234_3 in contact with a doped semiconductor zone 214_3 and located under a conductive gate 210_3. The area 910 defines a drain area of the transistor T3. The source areas of the transistors T1, T2 and T3 are coupled, preferably connected, to the respective nodes BL1, BL2, BL3.

The gates 210_1 and 210_2 of the transistors constitute a common conductive area 1202. The area 1202 has, for example, an elongated shape, preferably the shape of a rectilinear strip when viewed from above. The ribbon extends in the width direction of the transistors T1 and T2.

The gates 922 and 924 of the memory points 902 and 904 constitute a common conductive area 1204. The area 1204 has, for example, an elongated shape, preferably the shape of a strip when viewed from above, parallel to the width direction of the transistors T1 and T2.

The gate 210_3 of the transistor T3 extends in the width direction of the transistor T3, parallel to the width direction of the transistors T1 and T2. The transistors T1 and T2 preferably have a same width, which is less than half the width of the transistor $T_3$. The device 1200 is preferably symmetrical with respect to a plane S12-S12 transecting the transistor T3 and passing between the transistors T1 and T2.

A circuit for generating a physically unclonable function can comprise a plurality of devices 1200.

For instance, the devices 1200 are disposed in a matrix, and the width direction of the transistors corresponds to the row direction of the matrix.

The node WLa can thus be common to the various devices 1200 of a row. The nodes BL1 are separate in the various devices 1200 of a row, and the nodes BL2 are separate in the various devices 1200 of a row. The nodes BL1, BL2 and BL3 are common to the devices 1200 of a column of the matrix. A common circuit 1100 can thus be provided in order to generate physically unclonable function bits using the devices 1200 of the column.

As a variant, the devices 1200 are disposed in a line in the width direction of the transistors, in the same manner as in a row of the matrix.

Figure 13:
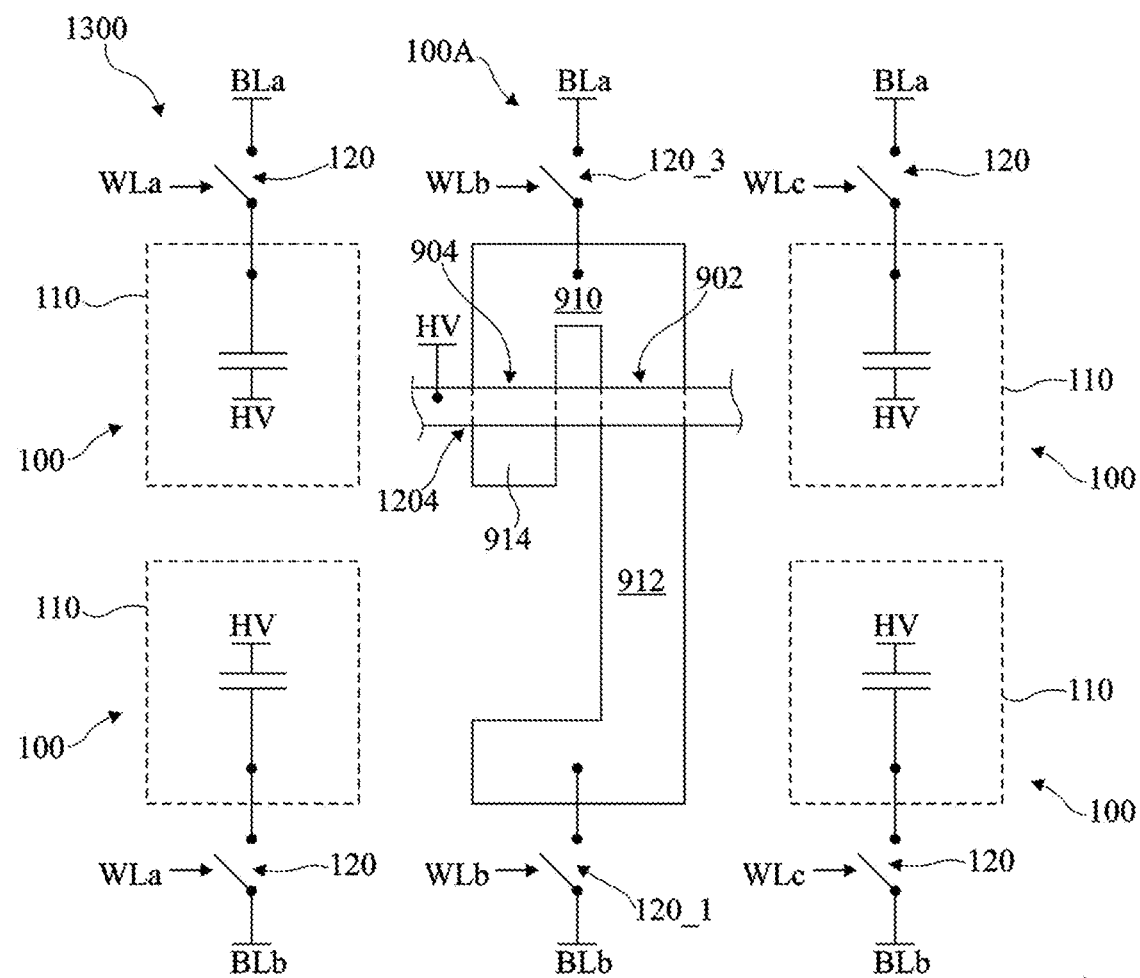
FIG. 13 illustrates a partial and schematic top view of an embodiment of a memory cell.

FIG. 13 illustrates a partial and schematic top view of an embodiment of a memory 1300. More specifically, the memory comprises a physically unclonable function generator.

The memory comprises assemblies 100, each comprising a memory cell associated in series with a switch no, as described in relation to FIG. 1. The assemblies 100 are disposed in a matrix, with the difference that, for pairs of adjacent cells no of the matrix, the pair of adjacent cells no has been replaced by a memory cell 110A of the device shown in FIG. 9. For instance, two rows and three columns of assemblies no are illustrated, the pair of cells of the central column being replaced by a memory cell 110A. Preferably, the numbers of rows and columns are higher than in this example.

In this example, the memory cells no of the two rows are adjacent. For this purpose, the switches 120 are disposed in each row on the side opposite the other row. In a matrix comprising more than two rows, the pairs of rows having the same arrangement as the rows of this example can be repeated. The memory cells of the adjacent rows are thus preferably symmetrical in relation to an axis such as the axis D (FIG. 4). In each row, the switches 120 connect the memory cells to a node BLa, BLb. The nodes BLa, BLb of the different rows are separate. In each column, the control terminals of the switches 120 are connected to a node WLa, WLc. The nodes WLa, WLc of the different rows are separate.

In the example shown, the matrix comprises a single cell 110A, the matrix, however, preferably comprising a plurality of cells 110A. The cell 110A occupies a space identical to that of the two adjacent cells. In other words, the memory comprises spaces arranged in a matrix; two adjacent cells no occupy two of these spaces, while the cell 110A occupies another two of these spaces. The spaces of the cell 110A are preferably in a same column.

The cell 110A comprises memory points 902 and 904 and semiconductor areas 910, 912 914 identical or similar to those described in relation to FIG. 10, arranged in an identical or similar manner. Preferably, the gates of the memory points 902 and 904 are defined by a common conductive area 1204. The area 1204 has, for example, an elongated shape, preferably in the form of a ribbon when viewed from above, extending in the direction of the rows.

The area 910 is connected by a switch 120_3 to the node BLa. The control terminal of the switch 120_3 is coupled, preferably connected, to a node WLb. The area 912 is connected by a switch 120_1 to the node BLa. The control terminal of the switch 120_1 is coupled, preferably connected, to the node WLb. Preferably, the switch 120_1 is identical to the switches 120 of the same row, in other words the switches 120_1 and 120 form a succession of identical switches disposed regularly in the row in question. Likewise, the switch 120_3 is preferably identical to the switches 120 of the same row.

In the memory 1300, the programming, in the cell 110A, of only one of the memory points 902 and 904, is carried out in the same manner as the programming of a memory cell no which would have been coupled to the switch 120_3 instead of the cell 110A. A physically unclonable function bit can be obtained from the cell 110A in the same manner as for the reading of a content of a cell no which would have been coupled to the switch 120_1 instead of the cell 110A. Thus, the programming of the cells 110A and no can be realized simply. Moreover, the generation of a physically unclonable function from the contents of cells 110A and the reading of the contents of the cells no can be carried out in a simple manner, preferably by the same circuit. An attacker could try to obtain the unique code of the physically unclonable function by monitoring the activity of the read circuit, but would not be able to distinguish between the bits of the physically unclonable function and the data read in the memory. The memory 1300 thus has a particularly high level of protection against the reading of the data that it contains by an unauthorized person.

Preferably, the cells 110A are dispersed at various locations of the matrix. This increases the difficulty for an attacker to distinguish between the physically unclonable function bits and stored data, thus increasing the level of protection.

Preferably, the circuit for reading the contents of the memory cells and for generating the physically unclonable function comprises a function for correcting errors. According to an advantage, it is possible with the memory 1300 to apply an error correction code to the physically unclonable function, without an additional error correction circuit. The memory 1300 is compatible with known error correction codes.

The switches 120, 120_1 and 120_3 and the nodes BLa, BLb, WLa, WLb, WLc can be any circuit capable of selecting one of the spaces of a matrix and programming and/or reading a memory cell located at the selected space. Preferably, the switches 120, 120_1 and/or 120_3 of a same row comprise transistors 120T, as described in relation to FIG. 3, the sources of which are coupled together by semiconductor areas 302. In a variant, the nodes BLa of a same row are separate, the nodes BLa and BLb of a same column are connected between each other, the nodes WLa, WLb, WLc of a same column are separate, and the nodes WLa, WLb and WLc of a same row are connected between one another.

Although the cell 110A of the example shown occupies adjacent spaces of the matrix located in a same column, in a variant the cell 110A occupies adjacent spaces located in a same row.

Figure 14:
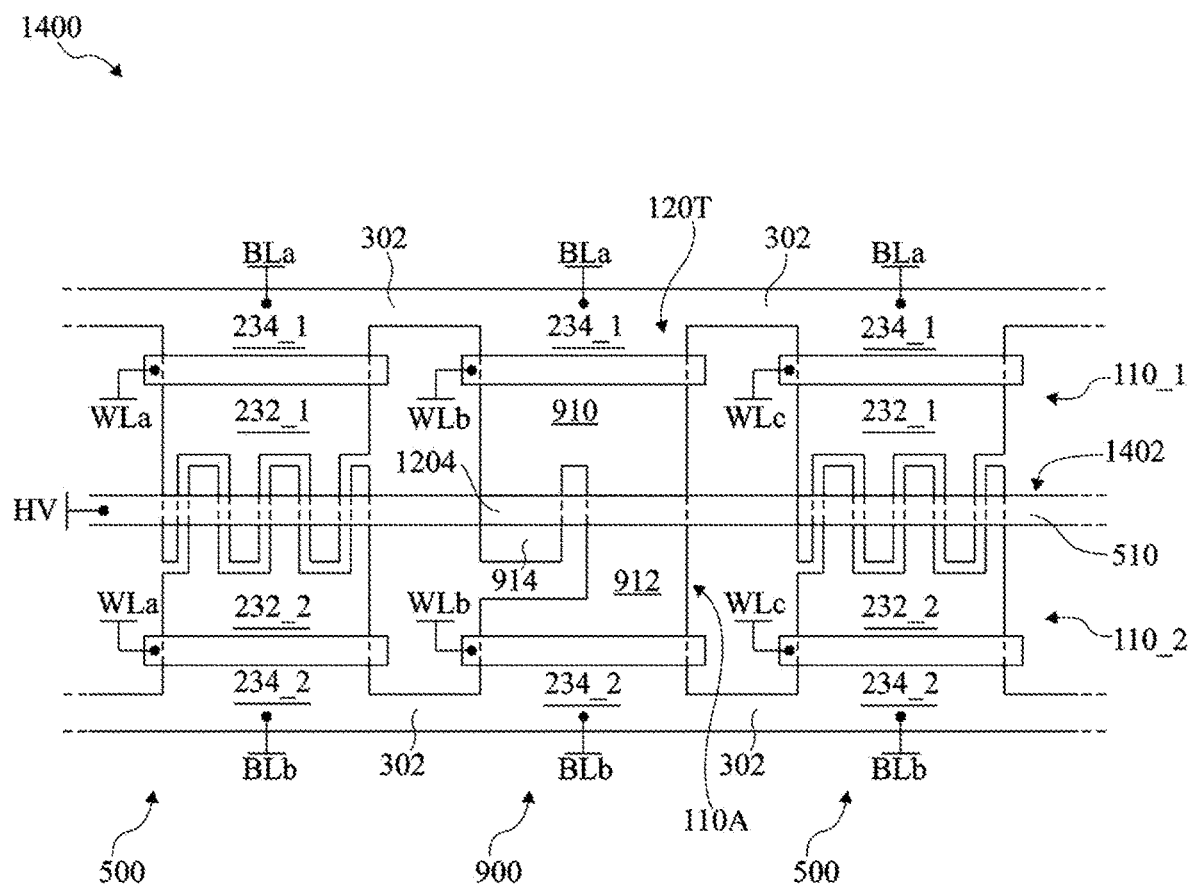
FIG. 14 illustrates a partial and schematic top view of an embodiment of a memory.

FIG. 14 illustrates a partial and schematic top view of an embodiment of a memory 140o. More specifically, the memory 1400 is the same type as the memory 1300 shown in FIG. 13. The memory 1400 comprises the same elements as those of the memory 800 of FIG. 8, arranged in the same way, with the difference that the two memory cells 110_1 and 110_2 of at least one device 500 are replaced by a memory cell 110A of a device 900 shown in FIG. 9.

The memory cell 110A preferably comprises the same elements as those of the memory cell no described in relation to FIG. 13, or identical or similar elements, arranged in an identical or similar manner. The areas 910 and 912 define drain areas of the transistors 120T. The conductive area 510, which defines the gates of the memory points of the devices 500, and the conductive area 1204, which defines the gates of the memory points of the device 900, constitute a common area 1402.

Since the memory 1400 is the same type as the memory 1300 and comprises devices 500, the memory 1400 has a particularly high level of protection of the data it contains.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

What is claimed is:

1. A device comprising:
   a first switch;
   a first irreversibly programmable memory point; and
   a second irreversibly programmable memory point coupled in parallel with the first irreversibly programmable memory point, wherein the first switch and the parallel combination of the first and second irreversibly programmable memory points are coupled in series between a first node and a second node, wherein the first switch and the parallel combination of the first and second irreversibly programmable memory points are connected at a connection node, the connection node comprising a first doped semiconductor area connecting the first and second memory points.

2. The device according to claim 1, wherein the first node and the second node are configured to receive a voltage for programming the first and second memory points.

3. The device according to claim 1, wherein the first switch is connected to a central portion of the first area.

4. The device according to claim 1, wherein the connection node further comprises a second doped semiconductor area connecting the first switch to the first memory point.

5. The device according to claim 4, further comprising:
   a third doped semiconductor area connected to the second memory point; and
   a second switch connected to the third area.

6. The device according to claim 4, further comprising an additional switch connected to a central part of the first area.

7. A device comprising:
   a first switch;
   a first irreversibly programmable memory point; and
   a second irreversibly programmable memory point coupled in parallel with the first irreversibly programmable memory point, wherein the first switch and the parallel combination of the first and second irreversibly programmable memory points are coupled in series between a first node and a second node, and wherein the first and second memory points each comprise a semiconductor zone and a gate located on the semiconductor zone.

8. The device according to claim 7, wherein the gates of the first and second memory points are defined by a conductive area.

9. The device according to claim 8, wherein the first switch and the parallel combination of the first and second irreversibly programmable memory points are connected at a connection node;
   wherein the connection node comprises a first doped semiconductor area connecting the first and second memory points;
   wherein the connection node further comprises a second doped semiconductor area connecting the first switch to the first memory point; and
   wherein the first and second areas are respectively located on either side of a vertical alignment with the conductive area.

10. A memory comprising:
    a semiconductor body; and
    a matrix of memory cells arranged in rows and columns disposed in the semiconductor body, each row comprising a plurality of devices that each include a first switch, a first irreversibly programmable memory point, and a second irreversibly programmable memory point coupled in parallel with the first irreversibly programmable memory point, wherein the first switch and the parallel combination of the first and second irreversibly programmable memory points are coupled in series between a first node and a second node, wherein the matrix further comprises a plurality of assemblies, each assembly comprising a memory cell and a switch, and wherein a surface area of the semiconductor body occupied by one of the devices is substantially identical to a surface area of the semiconductor body occupied by two of the assemblies located at adjacent spaces of the matrix.

11. The memory according to claim 10, wherein, for each device, the first switch and the parallel combination of the first and second irreversibly programmable memory points are connected at a connection node, the connection node comprising a first doped semiconductor area connecting the first and second memory points and a second doped semiconductor area connecting the first switch to the first memory point, each device further comprising a third doped semiconductor area connected to the second memory point and a second switch connected to the third area.

12. The memory according to claim 11, further comprising a circuit configured to select one of the devices and provide a logic value based on a comparison between currents flowing in the first and second switches of the selected device.

13. The memory according to claim 10, wherein, in each of the devices, only one of the first and second memory points is in a programmed state.

14. The memory according to claim 10, wherein the first and second memory points of each device comprise a semiconductor zone and a gate located on the semiconductor zone.

15. The memory according to claim 14, wherein the gate of each memory points is defined by a conductive area.

16. The memory according to claim 15, wherein for each device:
    the first switch and the parallel combination of the first and second irreversibly programmable memory points are connected at a connection node;
    the connection node comprises a first doped semiconductor area connecting the first and second memory points;
    the connection node further comprises a second doped semiconductor area connecting the first switch to the first memory point; and
    the first and second areas are respectively located on either side of a vertical alignment with the conductive area.

17. A method comprising programming a one time programming memory device that includes a first switch, a first irreversibly programmable memory point, and a second irreversibly programmable memory point coupled in parallel with the first irreversibly programmable memory point, wherein the first switch and the parallel combination of the first and second irreversibly programmable memory points are coupled in series between a first node and a second node, the first switch and the parallel combination of the first and second irreversibly programmable memory points being connected at a connection node, the connection node comprising a first doped semiconductor area connecting the first and second memory points, the programming comprising temporarily applying a voltage at the first and second nodes.

18. The method according to claim 17, wherein the method further comprises reading a value programmed in the memory device.

19. The method according to claim 18, wherein the reading comprises comparing a measured resistance value between the first and second nodes with a threshold value.

* * * * *